United States Patent [19]

Choi et al.

[11] Patent Number: 5,733,704
[45] Date of Patent: Mar. 31, 1998

[54] RESIST COMPOSITIONS FOR CHEMICALLY AMPLIFIED RESISTS COMPRISING A DI(T-BUTYL)MALONYL METHYL SIDE GROUP IN THE BASE POLYMER

[75] Inventors: Sang-jun Choi; Chun-geun Park, both of Kyungki-do, Rep. of Korea

[73] Assignee: Samsung Electronics Co., Ltd., Kyungki-Do, Rep. of Korea

[21] Appl. No.: 705,723

[22] Filed: Aug. 30, 1996

[30] Foreign Application Priority Data

Jul. 3, 1996 [KR] Rep. of Korea ............... 96-26828

[51] Int. Cl.$^6$ ................................. G03F 7/039
[52] U.S. Cl. .................. 430/270.1; 430/170; 430/905; 430/910
[58] Field of Search ................. 430/270.1, 170, 430/905, 910

[56] References Cited

U.S. PATENT DOCUMENTS

| | | | |
|---|---|---|---|
| 4,491,628 | 1/1985 | Ito et al. | 430/270.1 |
| 5,034,305 | 7/1991 | Nguyen-Kim et al. | 430/270.1 |
| 5,035,979 | 7/1991 | Nguyen-Kim et al. | 430/270.1 |
| 5,350,660 | 9/1994 | Urano et al. | 430/270.1 |
| 5,403,695 | 4/1995 | Hayase et al. | 430/270.1 |
| 5,412,050 | 5/1995 | Watanabe et al. | 430/270.1 |
| 5,523,370 | 6/1996 | Watanabe et al. | 430/270.1 |
| 5,532,106 | 7/1996 | Frechet et al. | 430/270.1 |

OTHER PUBLICATIONS

Choi et al., "Design and Properties of New Deep–UV Positive Photoresist", SPIE's 1996 International Symposium on Microlithography, Mar. 10–15, 1996, p. 15.

*Primary Examiner*—John S. Chu
*Attorney, Agent, or Firm*—Myers Bigel Sibley & Sajovec, LLP

[57] ABSTRACT

A resist composition by which high resolution patterns can be formed in a lithography process, due to its high sensitivity to light and large difference in solubilities in a developing solution before and after exposure to light, and which has excellent thermal characteristics. The resist composition is suitable for manufacturing highly integrated semiconductor chips.

8 Claims, 3 Drawing Sheets

RESIST COMPOSITIONS FOR CHEMICALLY AMPLIFIED RESISTS COMPRISING A DI(T-BUTYL)MALONYL METHYL SIDE GROUP IN THE BASE POLYMER

FIELD OF THE INVENTION

The present invention relates to resist compositions for chemically amplified resists. More particularly, the invention relates to resist compositions capable of forming high resolution patterns in a lithography process.

BACKGROUND OF THE INVENTION

With increasing integration of semiconductor chips, there is a need for resists which can be formed into finer patterns. Accordingly, deep-ultraviolet (deep-UV; 248 nm) rays having shorter wavelengths than conventional g-line (436 nm) and i-line (365 nm) rays are required. Accordingly, a new material called "chemically amplified resist" (CAR) has been introduced.

In general, a chemically amplified resist comprises a base resin, a dissolution inhibiting group introduced to control the solubility of the base resin, and a photoacid generator (PAG) for generating a proton ($H^+$) by exposure to light as essential components. This resist utilizes the catalytic proton generated from the PAG by the exposure to light. For example, a base resin having a protecting group is deprotected by the catalytic proton to have higher solubility, and the deprotecting reaction is amplified rapidly with the diffusion of proton, thereby forming patterns while maintaining high transparency.

The main factor determining the performance of a CAR is the contrast, which is an index indicating the change in solubility before and after exposure to light. The contrast is determined by the protecting group introduced for adjusting the solubility of the base resin.

U.S. Pat. No. 4,491,628 proposes a resist composition including a base resin of polyhydroxystyrene in which tert-butoxycarbonyl (t-BOC) groups are partially substituted. However, such a base resin has a lower decomposition temperature than its glass transition temperature. Also, a T-top profile is caused by a post exposure delay (PED).

SUMMARY OF THE INVENTION

In view of the above, it is an object of the present invention to provide resist compositions which are capable of forming high resolution patterns, and exhibit a large difference in solubility before and after exposure to light, and also exhibit excellent thermal characteristics.

As a first aspect, the present invention provides a resist composition comprising: (a) a base resin having the formula I:

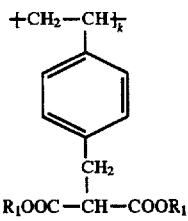

wherein $R_1$ is t-butyl or tetrahydropyranyl, and k is an integer between 20 and 500; and (b) between 1 and 20 weight percent photoacid generator based upon the weight of said base resin. The base resin has a weight average molecular weight ranging from 5,000 to 200,000. Preferably, the photoacid generator is selected from the group consisting of triarylsulfonium salts, diaryliodonium salts, and sulfonates.

As a second aspect, the present invention provides a resist composition comprising: (a) a base resin having the formula II:

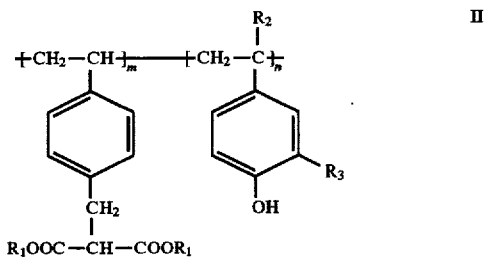

wherein $R_1$ is t-butyl or tetrahydropyranyl; $R_2$ and $R_3$ are each independently H or methyl; and n and m are defined so that the ratio of $n/(m+n)$ is from 0.1 to 0.9; and (b) between 1 and 20 weight percent photoacid generator based upon the weight of said base resin. The base resin has a weight average molecular weight ranging from 5,000 to 200,000. Preferably, the photoacid generator is selected from the group consisting of triarylsulfonium salts, diaryliodonium salts, and sulfonates.

DETAILED DESCRIPTION OF THE INVENTION

Figure 1A:
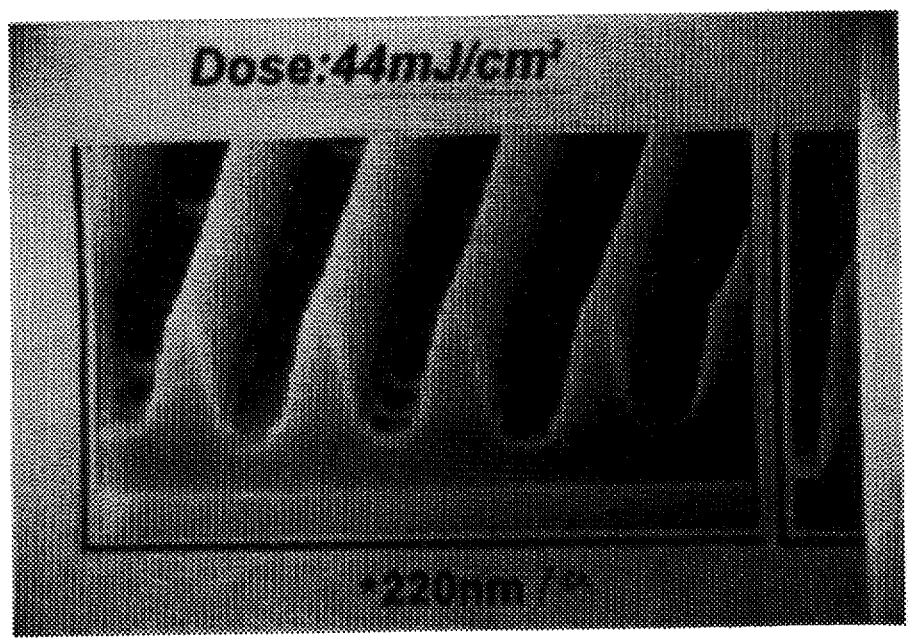
FIGS. 1A, 1B, 1C, and 1D are scanning electron microscope (SEM) pictures of a photoresist pattern formed according to an embodiment of the present invention, showing patterns at the lower portion having widths of 220 nm (FIG. 1A), 240 nm (FIG. 1B), 260 nm (FIG. 1C) and 280 nm (FIG. 1D), respectively.
Figure 1B:
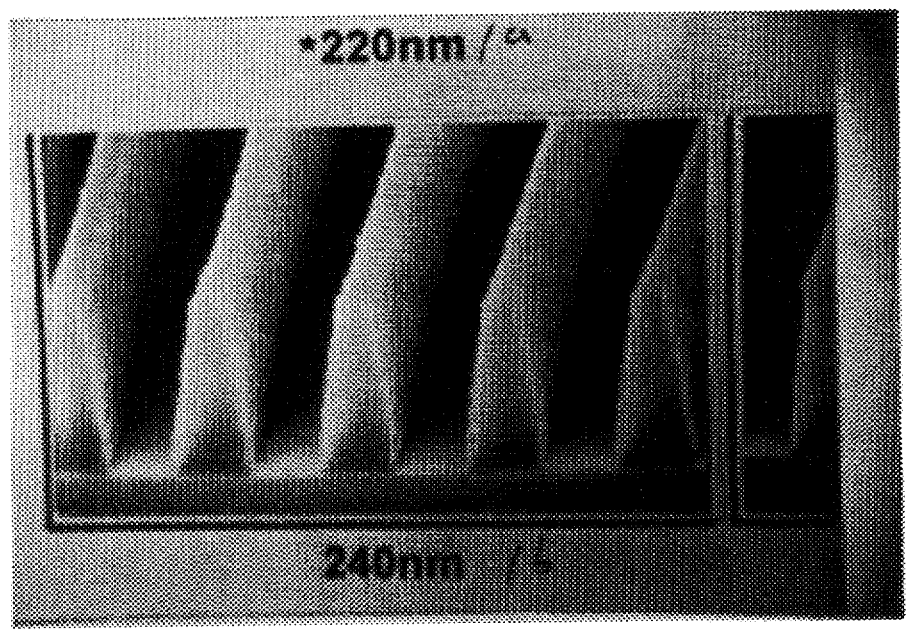
Figure 1C:
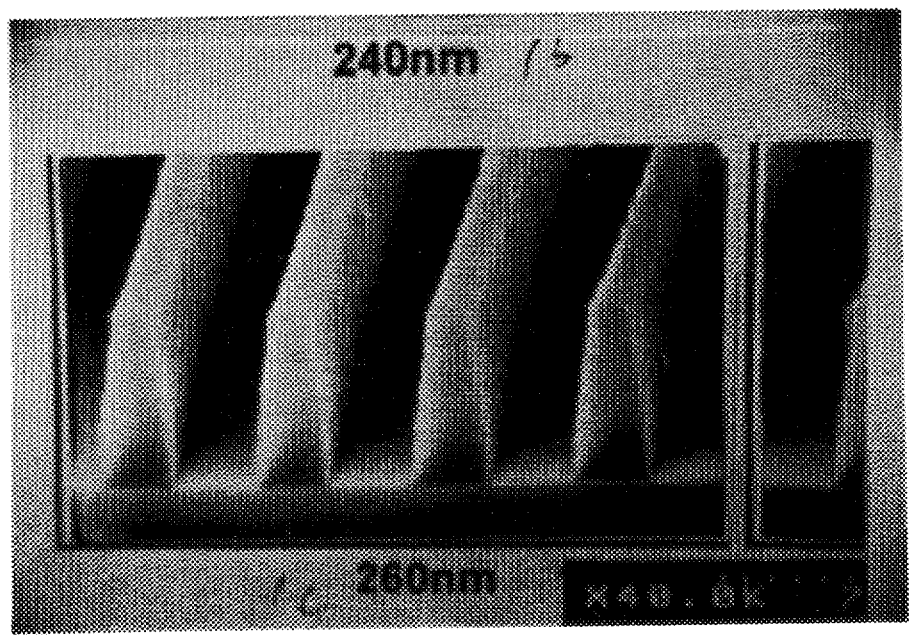
Figure 1D:
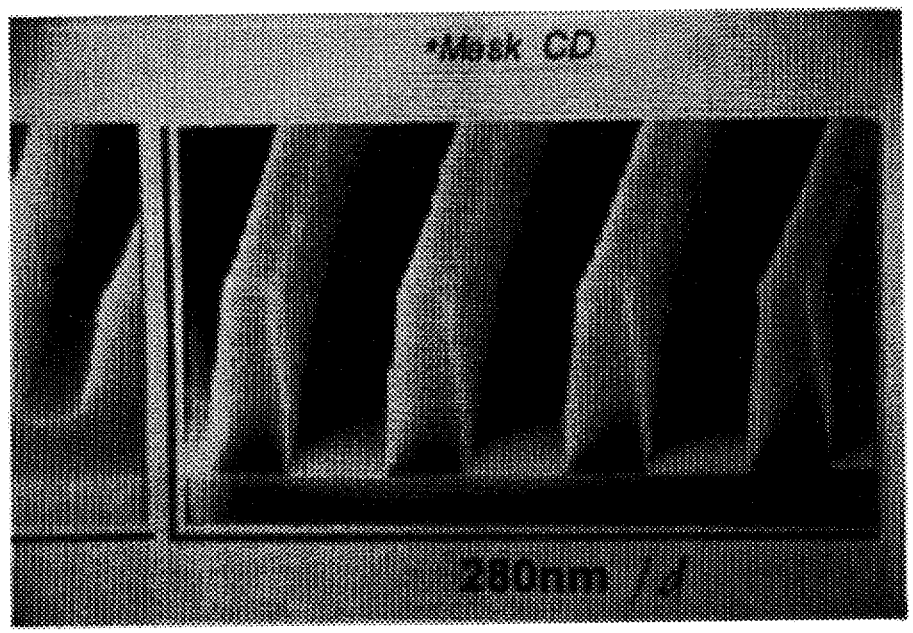

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

The resist compositions according to the present invention are characterized in that two t-butyl groups or two tetrahydropyranyl groups are formed at predetermined sites of the base resin. These t-butyl groups or tetrahydropyranyl groups act as a dissolution inhibitor in the formulation of resists.

As one advantage, the base resin exhibits a higher decomposition temperature than a polymer having t-BOC groups and also exhibits excellent dissolution inhibiting effects. The conventional base resin of a polyhydroxystyrene in which t-BOC groups are partially substituted, decomposes actively at a temperature of 120° C. or higher. In contrast, the base resin of the present invention starts to decompose at a temperature of 160° C.

The two t-butyl groups or two tetrahydropyranyl groups formed on predetermined sites of the base resin serve to inhibit dissolution of the resins prior to exposure to light. Upon exposure, acidolysis of the resins converts the two t-butyl groups or two tetrahydropyranyl groups into two carboxyl groups per site. The presence of the carboxyl groups significantly increases the solubility of the base resin in a developing solution at the point of exposure. Thus, the formation of the carboxyl groups at these sites in the resist compositions of the present invention facilitates the formation of fine patterns in a lithography process. The resist composition is suitable for manufacturing highly integrated semiconductor chips.

The following examples are provided to illustrate the present invention, and should not be construed as limiting thereof. In these examples, "g" means grams, "µg" means micrograms, "ml" means milliliters, "µm" means micrometers, "mmol" means millimole, and "° C." means degrees Centigrade.

EXAMPLE 1

Di-(t-butyl) malonyl methyl styrene (3 g, 9 mmol) and 3 g of acetoxy styrene (18 mmol) were dissolved in 25 ml of toluene. Azobisisobutyronitrile (0.22 g), as a polymerization initiator, was added to the solution, and then reacted at 70° C. for 24 hours. Then, excess petroleum ether was poured into the resultant to precipitate the reaction product. The precipitated product was washed with methanol and filtered. The precipitate was dried in a vacuum oven at 50° C. for 24 hours to obtain a polymer represented by the following formula (II-1) (yield: 85%).

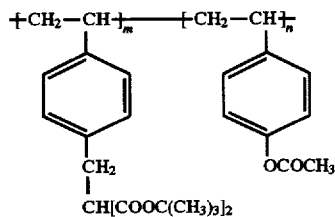

EXAMPLE 2

The polymer (5 g) prepared in Example 1 was dissolved in 60 ml of dioxane. 80% Hydrazine aqueous solution (5 ml) was added to the solution, and then reacted at room temperature for 5 hours. Subsequently, the resultant was slowly added to excess water, and then neutralized with HCl. A polymer precipitate was filtered by a glass filter, the precipitate was dissolved in tetrahydrofuran, and then reprecipitated in n-hexane. The reprecipitated polymer was filtered, and the precipitate was dried in a vacuum oven at 50° C. for 24 hours to obtain a copolymer represented by the following formula (II-2) (yield: 95%).

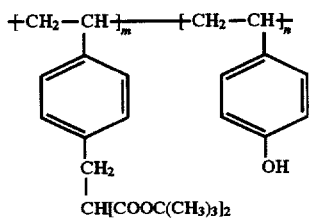

EXAMPLE 3

The copolymer (1 g) prepared in Example 2 was dissolved in 8 ml of propylene glycol monomethyl ether acetate, and then 0.05 g of triphenylsulfonium triflate was added thereto and stirred to produce a resist composition.

The surface of a silicon wafer was treated with hexamethyldisilazane, and then the prepared resist composition was coated thereon to form a 0.60 µm thick photoresist layer. The photoresist layer was pre-baked at 110° C. for 60 seconds. The photoresist layer was exposed to light by using a KrF excimer laser (NA 0.45), and baked at 110° C. for 60 seconds. Finally, the resultant was developed using a developing solution composed of 2.38 weight percent of tetramethylammonium hydroxide and the balance amount of pure water to form a photoresist pattern.

As shown in FIGS. 1A–1D, fine patterns can be formed by using the resist composition according to the present invention.

EXAMPLE 4

Figure 2:
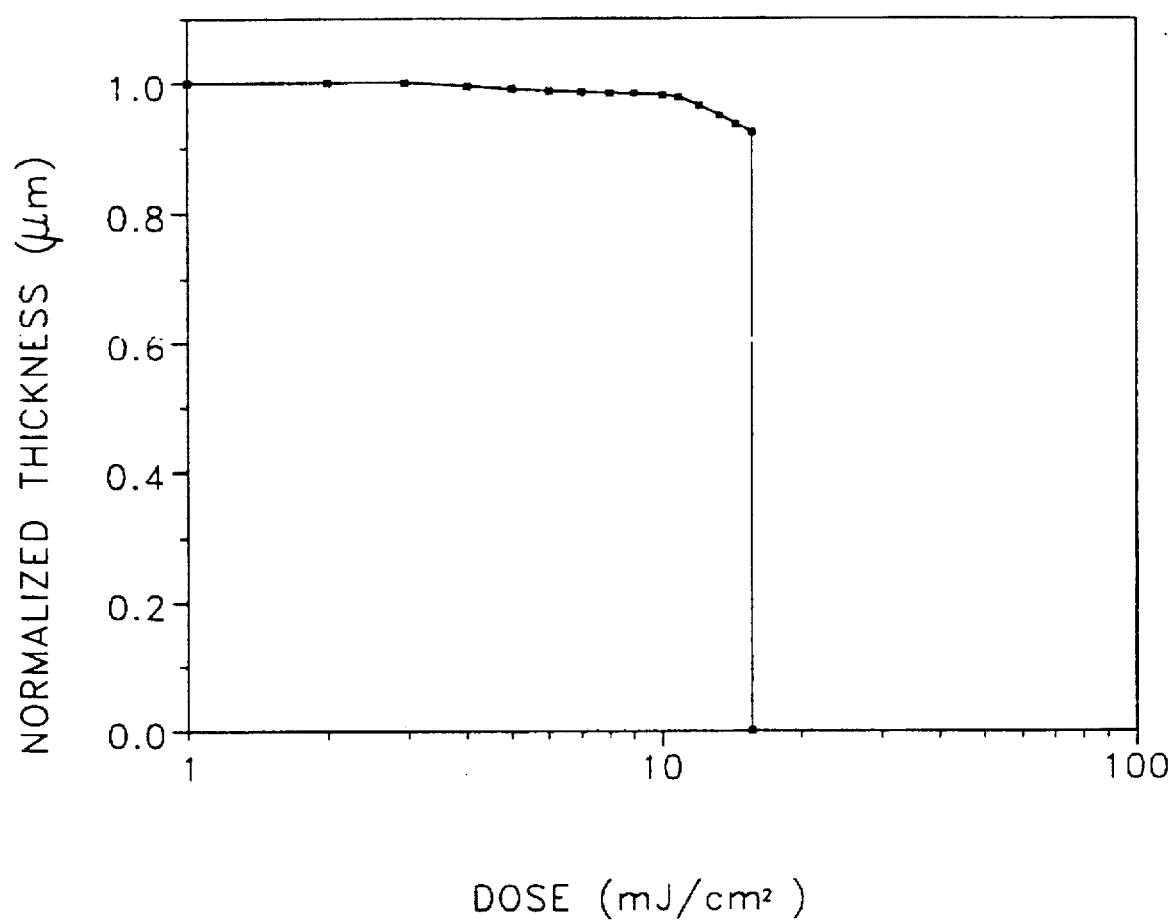
FIG. 2 is a graph showing the normalized thickness of a photoresist layer versus dosage of exposure.

In order to measure contrast curve of the resist composition of the present invention, patterns were formed by the same method as that used in Example 3, except for the exposure dosage. FIG. 2 is graph showing the normalized thickness, in micrometers, of the resist layer, i.e., the thickness of the resist layer remaining in the exposed portion when the thickness of the initially coated resist layer is set to 1 µm, depending on the dosage. Referring to the graph of FIG. 2, at a dosage of or above a predetermined level, the thickness decreases dramatically, implying that the contrast of the resist composition according to the present invention is very high.

As described above, the resist composition according to the present invention has a great difference in solubility between before and after exposure to light and is excellent in its thermal characteristics. Therefore, using the resist in a lithography process allows the formation of patterns having high resolution, which is suitable for manufacturing highly integrated semiconductor chips.

In the drawings, detailed description, and examples there have been disclosed typical preferred embodiments of the invention and, although specific terms are employed, they are used in a generic and descriptive sense only and not for purposes of limitation, the scope of the invention being set forth in the following claims, with equivalents of the claims to be included therein.

That which is claimed is:

1. A resist composition comprising:

(a) a base resin having the formula I:

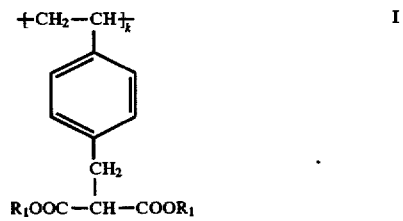

wherein $R_1$ is t-butyl or tetrahydropyranyl, and k is an integer between 20 and 500; and (b) between 1 and 20 weight percent photoacid generator based upon the weight of said base resin.

2. The resist composition according to claim 1, wherein said photoacid generator is selected from the group consisting of triarylsulfonium salts, diaryliodonium salts, and sulfonates.

3. The resist composition according to claim 1, wherein said base resin has a weight average molecular weight ranging from 5,000 to 200,000.

4. The resist composition according to claim 1, wherein $R_1$ of said base resin of formula I is t-butyl.

5. A resist composition comprising:
   (a) a base resin having the formula II:

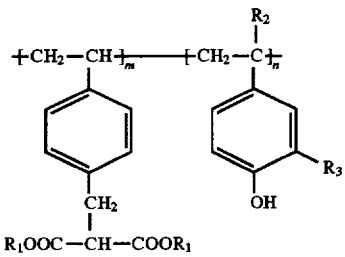

II wherein $R_1$ is t-butyl or tetrahydropyranyl; $R_2$ and $R_3$ are each independently H or methyl; and n and m are defined so that the ratio of n/(m+n) is from 0.1 to 0.9; and
   (b) between 1 and 20 weight percent photoacid generator based upon the weight of said base resin.

6. The resist composition according to claim 5, wherein said photoacid generator is selected from the group consisting of triarylsulfonium salts, diaryliodonium salts, and sulfonates.

7. The resist composition according to claim 5, wherein said base resin has a weight average molecular weight ranging from 5,000 to 200,000.

8. The resist composition according to claim 5, wherein $R_1$ of said base resin of formula II is t-butyl and $R_2$ is H.

* * * * *